（12) United States Patent
Berggren et al.

(10) Patent No.: US 10,274,548 B2
(45) Date of Patent: Apr. 30, 2019

(54) TIERED SUPERCONDUCTING QUANTUM INTERFERENCE DEVICE (SQUID) ARRAY

(71) Applicants: Susan Anne Elizabeth Berggren, San Diego, CA (US); Robert Lewis Fagaly, Carlsbad, CA (US)

(72) Inventors: Susan Anne Elizabeth Berggren, San Diego, CA (US); Robert Lewis Fagaly, Carlsbad, CA (US)

(73) Assignee: United States of America as represented by the Secretary of the Navy, Washington, DC (US)

( * ) Notice: Subject to any disclaimer, the term of this patent is extended or adjusted under 35 U.S.C. 154(b) by 297 days.

(21) Appl. No.: 15/230,656

(22) Filed: Aug. 8, 2016

(65) Prior Publication Data

US 2017/0045592 A1    Feb. 16, 2017

Related U.S. Application Data

(60) Provisional application No. 62/203,808, filed on Aug. 11, 2015.

(51) Int. Cl.
| | | |
|---|---|---|
| G01R 33/035 | (2006.01) | |
| G01R 33/00 | (2006.01) | |
| G01R 33/02 | (2006.01) | |

(52) U.S. Cl.
CPC ..... *G01R 33/0354* (2013.01); *G01R 33/0094* (2013.01); *G01R 33/0206* (2013.01)

(58) Field of Classification Search
CPC ............ G01R 33/0354; G01R 33/0094; G01R 33/0206

(Continued)

(56) References Cited

U.S. PATENT DOCUMENTS

| | | | | |
|---|---|---|---|---|
| 6,483,339 | B1* | 11/2002 | Durand | H03K 19/1952 326/5 |
| 9,097,751 | B1* | 8/2015 | Longhini | G01R 33/0354 |
| 9,664,751 | B1* | 5/2017 | Berggren | G01R 33/0354 |

OTHER PUBLICATIONS

Berggren, Susan et al., Computational and Mathematical Modeling of coupled Superconducting Quantum Interference Devices, San Diego State Dissertation, pp. 1-231, 2012.

(Continued)

*Primary Examiner* — Reena Aurora
(74) *Attorney, Agent, or Firm* — NavInfWarCen Pacific; Arthur K. Samora; Kyle Eppele

(57) ABSTRACT

A device in accordance with several embodiments can include a plurality of N Superconducting Quantum Interference Devices (SQUIDs), which can be divided into a plurality of sub-blocks of SQUIDs. The SQUIDs in the sub-blocks can be RF SQUIDs, DC SQUIDs or bi-SQUIDs. The sub-blocks can be arranged in a plurality of X tiers, with each $T_i$ tier having a different number of sub-blocks of SQUIDs than an immediately adjacent $T_i$ tier. Each $T_i$ tier can have the same total bias current; and can have SQUIDs with different critical currents and loop sizes, with the different loop sizes on each tier having a Gaussian distribution of between 0.5 and 1.5 (or a random distribution). Additionally, the Arrays can be configured as three independent planar arrays of SQUIDs. The three planar arrays can be triangular when viewed in top plan, and can be arranged so that they are orthogonal to each other.

20 Claims, 8 Drawing Sheets

(58) Field of Classification Search
USPC .......................................................... 324/247
See application file for complete search history.

(56) References Cited

OTHER PUBLICATIONS

Fagaly, R.L., Superconducting Quantum Interference Device Instruments and Applications, Review of Scientific Instruments, 77, 101101, pp. 1-42, (2006).

Fagaly, R.L., Types of SQUIDs, Seidal c9.2.tex V1, pp. 5-19, Sep. 4, 2014.

Berggren, Susan et al. Superconducting Quantum Interference Devices Arranged in Pyramid Shaped Arrays, IEEE Transactions on Applied Superconductivity, vol. 25, Issue 3, DOI: 10.1109/TASC.2014.2361490, Oct. 3, 2014.

* cited by examiner

TIERED SUPERCONDUCTING QUANTUM INTERFERENCE DEVICE (SQUID) ARRAY

CROSS REFERENCE TO RELATED APPLICATIONS

This application claims the benefit of U.S. Provisional Application 62/203,508, filed Aug. 11, 2015, by Susan Anne Elizabeth Berggren et al. and entitled "Superconducting Quantum Interference Devices Arranged in Pyramid Shaped Arrays". The contents of the '508 application are hereby incorporated by reference into this specification.

FEDERALLY-SPONSORED RESEARCH AND DEVELOPMENT

The United States Government has ownership rights in this invention pursuant to passing of title to a Subject Invention under Contract N66001-09-D-0020 (Leidos). Licensing inquiries may be directed to Office of Research and Technical Applications, Space and Naval Warfare Systems Center, Pacific, Code 72120, San Diego, Calif., 92152; telephone (619) 553-5118; email: ssc_pac_t2@navy.mil, referencing NC 103272.

FIELD OF THE INVENTION

The present invention pertains generally to Superconducting Quantum Interference Devices (SQUIDs). More particularly, the invention pertains to a configuration of SQUID Arrays that offer increased linearity. Additionally, the invention pertains to array designs for SQUID arrays that could be beneficial in a robust 3D structure. The invention is particularly, but not exclusively, useful as a 3D SQUID array which can be optimized for direction finding (DF) by varying the critical currents and SQUID loop sizes on each face of the 3D array.

BACKGROUND OF THE INVENTION

Superconducting Quantum Interference Devices (SQUIDs) can comprise tiny loops of superconducting material in which one or more Josephson junctions interrupt the loop path. A Josephson junction can be a region of material that can provide a weak link between two fully superconducting regions. Superconducting electrons can quantum mechanically tunnel across the Josephson junction in a well-understood process.

The DC SQUID can have two symmetrical Josephson junctions, and DC SQUIDs can typically sense extremely small magnetic fields. Non-uniforms arrays of DC SQUIDs and DC bi-SQUIDs, which are DC SQUIDs with an additional Josephson junction bisecting the superconducting loop, have been modeled in different array designs and coupling schemes in the prior art, to determine their linearity and sensing capacities. SQUIDs have been fabricated in both low and high temperature superconducting materials. SQUIDs can be extremely sensitive; a SQUID-based sensor can detect minute magnetic fields and can be decoupled from the size of the signal wavelength. As a result, the sensors can sense signals over a wide range of frequencies, from the direct current (DC) to the Gigahertz (GHz) range, and theoretically up to the THz range.

SQUID arrays are now being explored for a wide variety of applications, including medical applications (such as low-field magnetic resonance imaging (MRI) applications, for example), geophysical exploration (e.g., oil and mineral location), non-destruction testing and RF detection purposes. With respect to RF detection, a SQUID-based RF detection device (antenna) would not work in a traditional sense (i.e., as traditional antennas do with resonance). Instead, and as mentioned above, SQUID arrays could detect minute magnetic fields, yet could be decoupled from the size of the wavelength corresponding to the generated magnetic field being detected. This means the SQUID antenna device could sense signals in the MHz range, but because of the decoupling aspect, the device could still be fully contained on a 1 cm×1 cm chip.

An important feature in signal detection is direction finding (DF). In order to develop a device able to sense a signal and determine the direction of propagation, a solid three-dimensional structure with a 2D chip that includes a SQUID on each side could allow simultaneous detection of all three components ($B_x, B_y, B_z$) of a magnetic field.

In view of the above, it can be an object of the present invention to provide a 3D SQUID array which can be small enough to be integrated onto a 1 cm×1 cm or similarly sized chip. Another object of the present invention can be to provide a 3D SQUID array having pyramidal geometry, but without sacrificing linearity of anti-peak response. Yet another object of the present invention can be to provide an antenna that incorporates SQUIDs to detect signals without resonating. Still another object of the present invention can be to provide a 3D SQUID array which can detect magnetic fields in three (orthogonal) dimensions. Another object of the present invention to provide a 3D SQUID array and method for manufacture that can be consistently fabricated in a cost-effective manner.

SUMMARY OF THE INVENTION

An antenna in accordance with several embodiments can include a plurality of N Superconducting Quantum Interference Devices (SQUIDs). The plurality of N SQUIDs can be divided into three independent planar arrays of SQUIDs, and each planar array can be further divided into a plurality of sub-blocks of SQUIDs. The SQUIDs in the sub-blocks can be RF SQUIDs, DC SQUIDs, bi-SQUIDs, or even smaller sub-arrays of RF SQUIDs, DC SQUIDs, and bi-SQUIDs. The resulting planar arrays can be triangular, diamond-shaped, etc. when viewed in plan view.

The sub-blocks can be arranged in a plurality of X $T_1$, $T_2$, $T_3$, . . . $T_x$ tiers, with each $T_2$ through $T_x$ tier having a different number of sub-blocks of SQUIDs than the $T_{x-1}$ tier immediately above the $T_{x-1}$ tier. Each $T_x$ tier can have the same total bias current, and the planar configurations can be arranged so that each independent planar configuration is orthogonal to each other. In several embodiments, for each $T_x$ tier, each SQUID in the respective $T_x$ tier can have a different loop size, and the different loop sizes can have a Gaussian distribution of between 0.5 and 1.5. If a respective tier $T_x$ has a plurality of p sub-blocks, the bias current for said sub-block in said tier $T_x$ is the total bias current divided by p.

BRIEF DESCRIPTION OF THE DRAWINGS

The novel features of the present invention will be best understood from the accompanying drawings, taken in conjunction with the accompanying description, in which similarly-referenced characters refer to similarly-referenced parts, and in which.

DETAILED DESCRIPTION OF THE EMBODIMENTS

Figure 1:
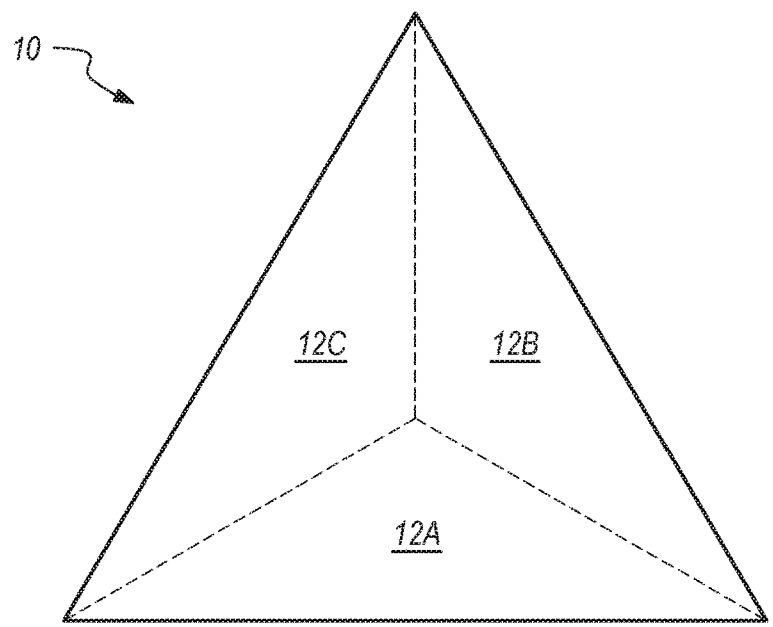
FIG. 1 is a side elevational view of the three-dimensional (3D) Superconducting Quantum Interference Device (SQUID) array of the present invention according to several embodiments.
Figure 2:
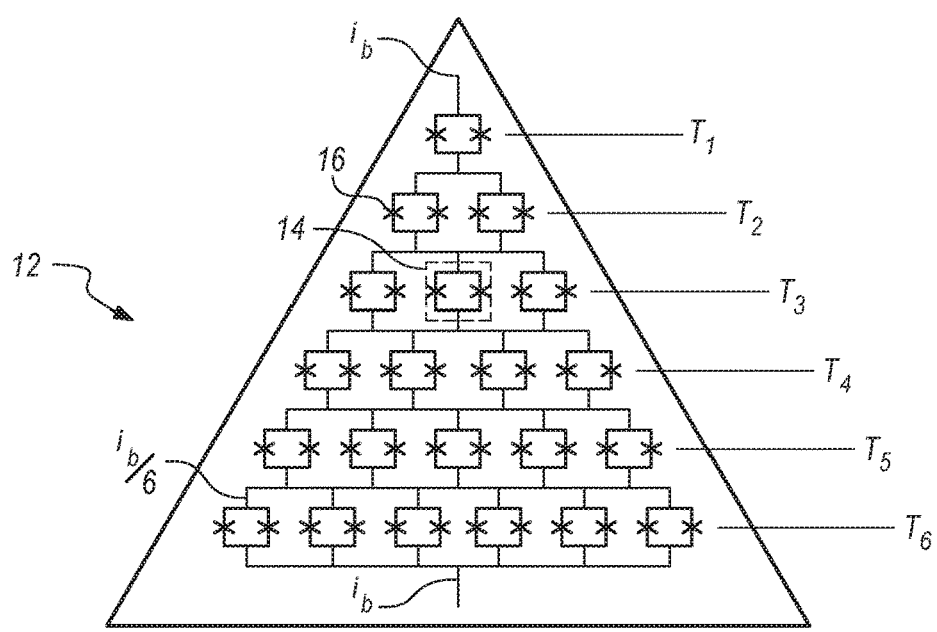
FIG. 2 is a plan view of a planar array of the device of FIG. 1.

Referring initially to FIGS. 1-2, a three dimensional (3D) Superconducting Quantum Interference Device (SQUID) antenna device of the present invention according to several embodiments is shown and is generally designated by reference character 10. As shown, device 10 can have a plurality of SQUIDs that can be arranged into three independent planar arrays 12a, 12b, and 12c, so that arrays 12a, 12b and 12c can all be orthogonal to each other. Each planar array 12 can have its own input bias current, $i_b$ (please see FIG. 2). The manner in which the bias current feeds each planar array 12, and the structure of the planar array 12 can be seen and can be described more fully below.

I. Single Squid Triangular Array

In FIG. 2, the structure of the planar array 12 is shown in greater detail. As shown in FIG. 2, each planar array 12 can be arranged in a plurality of X tiers $T_1$, $T_2$, $T_3$ through $T_X$ (in FIG. 2, X=6). Each tier $T_i$ can be further arranged into a plurality of sub-blocks 14 of SQUIDs 16. Planar array 12 can further have a bias current $i_b$ that can be input into tier $T_1$ of planar 14, as shown in FIG. 2. For each tier $T_1$ through $T_X$, the number of sub-blocks in each tier $T_i$ is different from the number of sub-blocks in an adjacent tier $T_{i-1}$ or $T_{i+1}$, but the total input bias current for each tier can be the same. For example, the number of sub-blocks 16 in tier $T_3$ is 3, while the number of sub-blocks in tier $T_2$ is 2. However, the input bias current into each sub-block 16 in tier $T_3$ is $(3 \times i_b/3 = i_b)$. Similarly, the input bias current into tier $T_2$ is $(2 \times i_b/2 = i_b)$.

Figure 3:
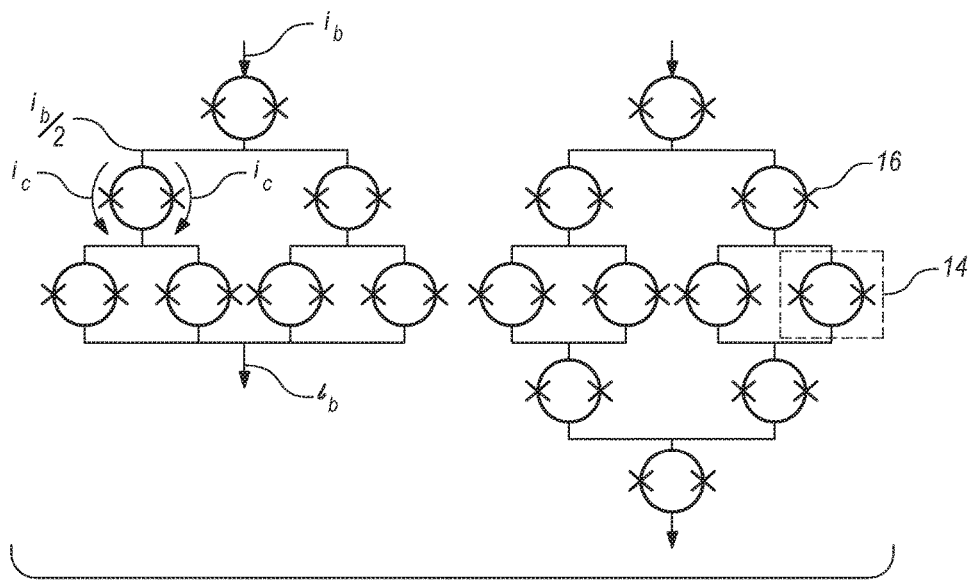
FIG. 3 is a plan view of alternative embodiments of the planar array of FIG. 2.

FIG. 2 illustrates a scenario where the number of sub-blocks 14 increases with each tier $T_i$. Such a configuration can result in a planar array 12 that can be triangular when viewed in plan view, and it is shown in FIG. 2. However, it should be appreciated that the number of sub-blocks can increase or decreases, and the rate of increase/decrease does not have to be uniform, provided the number of sub-blocks is different for adjacent tiers. For example, and as shown in FIG. 3 on the left, tiers $T_1$, $T_2$ and $T_3$ have configurations of 1-2-4 sub-blocks 14. For the embodiment shown in FIG. 3 on the right, tiers $T_1$ through $T_5$ have a 1-2-4-2-1 configuration. Other configurations are certainly possible.

A. Modeling Equations

For a fast, simple simulation in order to see the effects of a different number of SQUIDs on each tier, a basic array 21 of single DC SQUIDs was used. Returning the triangular planar configuration shown in FIG. 2, a planar array 14 is shown with tiers $T_1$-$T_6$ of one through six sub-blocks 14, with each sub-block 14 being a single DC SQUIDs, for a total of 21 DC SQUIDs. The equations are derived using Kirchhoff's current law and determine the phase differences across each on the junctions in the array. For brevity, the derivations in this application are not shown. The derivations can be found a paper by S. Berggren, "Computational and Mathematical Modeling of Coupled Superconducting Quantum Interference Devices," Ph.D. dissertation, San Diego State University and Claremont Graduate University, (2012).

The equations for the triangular arrangement are:

$$\dot{\varphi}_{1,k} = J + \frac{1}{\beta_k}\left(\varphi_{c,k} + \varphi_{2,k} - \varphi_{1,k} - \sum_{i \neq k} \frac{M}{\beta_i}(\varphi_{c,i} + \varphi_{2,i} - \varphi_{1,i})\right) - \quad (1)$$

$$i_{c,1,k}\sin\varphi_{1,k}$$

$$\dot{\varphi}_{2,k} = J - \frac{1}{\beta_k}\left(\varphi_{c,k} + \varphi_{2,k} - \varphi_{1,k} - \sum_{i \neq k} \frac{M}{\beta_i}(\varphi_{c,i} + \varphi_{2,i} - \varphi_{1,i})\right) -$$

$$i_{c,2,k}\sin\varphi_{2,k}$$

where $\varphi_{j,k}$ is the phase of the $j^{th}$ junction of the $k^{th}$ SQUID and $i_{c,j,k}$ is the normalized critical current of the $j^{th}$ junction of the $k^{th}$ SQUID, for j=1, 2 and k=1, . . . , 21. The dots denote the time differentiation with normalized time $\tau = \omega_c t$. The parameter $$\omega_c = \frac{2eI_0 R_N}{\hbar},$$

where $R_N$ is the normal state resistance of the Josephson junctions, $I_0$ is the normalizing current, e is the charge of an electron, and $\hbar$ is the reduced Planck constant. The parameter $J = i_b/2$, where $i_b$ is the normalized bias current and $\varphi_{e,k} = 2\pi x_e a_k$, where $x_e$ is the normalized external magnetic flux per unit area and $a_k$ is the SQUID area. We use the approximate assumption that $a=\beta$ (i.e., that the SQUID physical area is roughly equivalent to the loop size). M can be the coupling parameter related to the distance between the two SQUIDs. The following results involve coupling of nearest neighbor SQUIDs.

B. Computational Modeling

The differential equations in Eq. (1) can integrated in Matlab (or any other suitable tool for mathematical applications), and the average voltage response {V} can be plotted. The voltage response {V} can be the average over time of $$V(t) = \sum_{k=1}^{N} \frac{\dot{\varphi}_{1,k} + \dot{\varphi}_{2,k}}{2}.$$

When detecting signals, the device is biased to the most linear section with the greatest voltage dynamic range, so a response with the greatest linearity and voltage dynamic range is what is desired, for optimal range, accuracy and selectivity.

Figure 4:
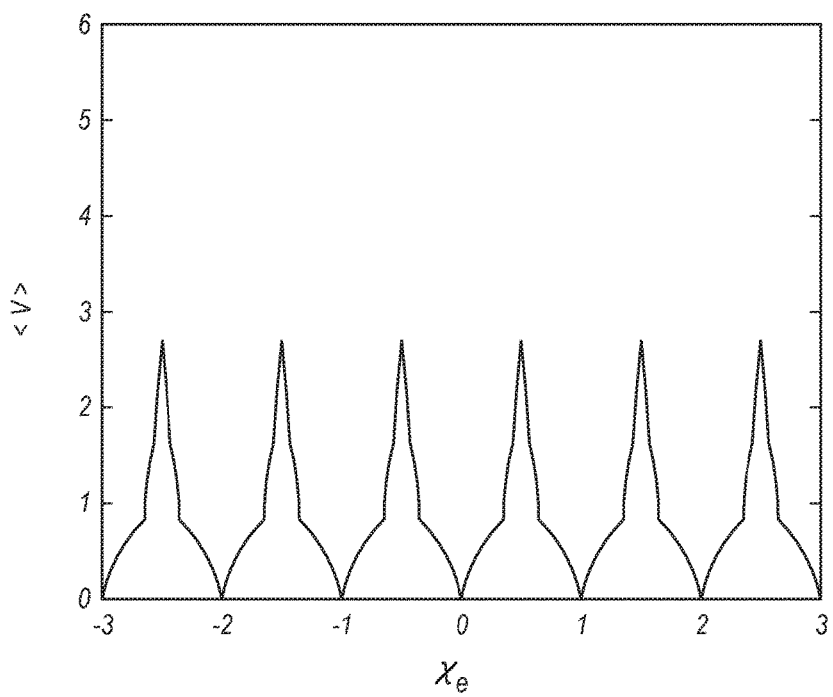
FIG. 4 is a graph of the voltage response of the planar array of FIG. 2 when critical current and loop size remain constant for each tier.
Figure 5:
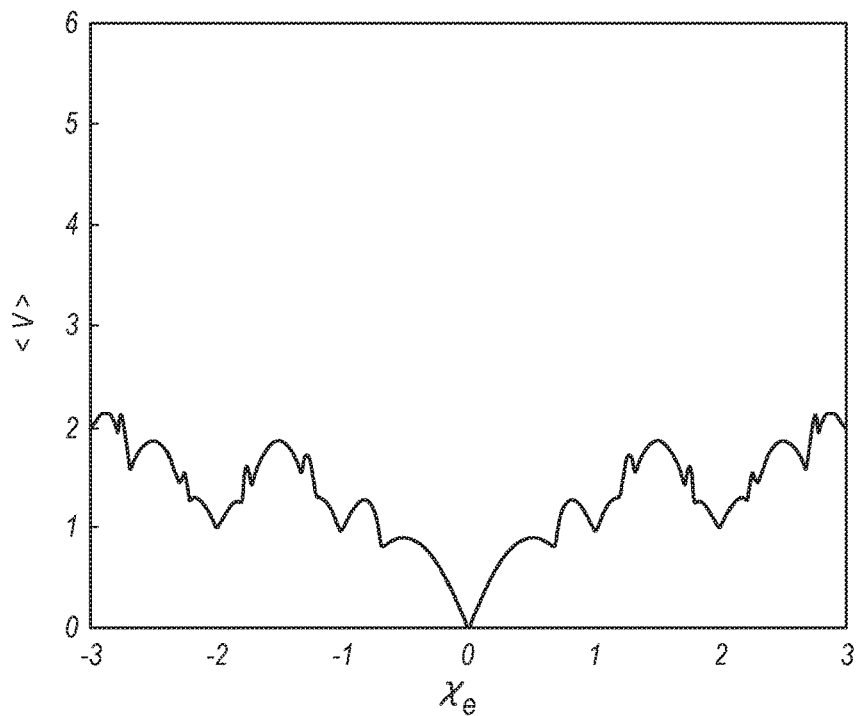
FIG. 5 is the same graph as FIG. 4, but with critical current constant and loop size decreasing for each tier.

Referring now to FIGS. 4-7, the effects of different values of critical currents (critical current $i_c$ is the current going through a Josephson junction, see FIG. 3) and loop sizes, $i_c$ and β, on the voltage response {V} can be seen. FIG. 4 can be the response for an array with all identical values (β=1.0) and all identical $i_c$'s ($i_c$=1.0). From FIG. 4, it can be inferred that other than the top SQUID in the triangular array, the remaining SQUIDs do not receive enough current to be in the running state. In FIG. 5, all SQUID's in the triangular array had an identical critical currents $i_c$'s ($i_c$=1.0), but decreasing β's. The decreasing values are related to the tier they are located on, i.e. $β_k$=1/T, where T is the tier where SQUID k is located. In FIG. 5, both the responses are not in the running state past the top SQUID, and the periodicity is increasing as the model progresses down each successive tier T. The result can be a non-periodic response that has a low voltage swing.

Figure 6:
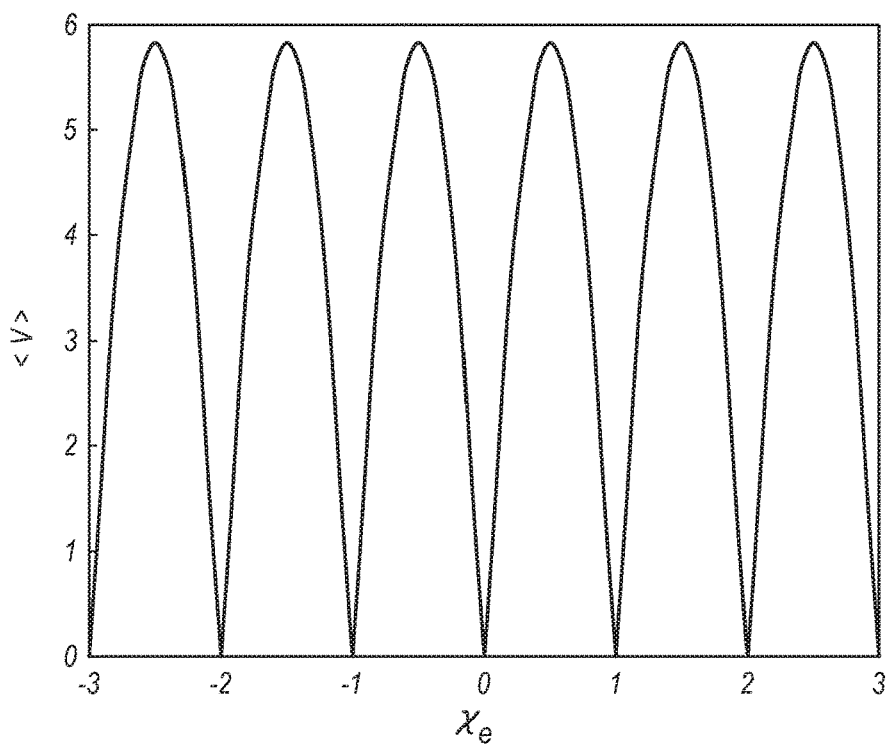
FIG. 6 is the same graph as FIG. 4, but with critical current decreasing and loop size remaining constant for each tier.

FIG. 6 is a graph of the voltage response for an array with identical β values (β=1.0) and decreasing $i_c$'s ($i_{c,k}$=1/T, where T is the tier of SQUID k). This response is oscillatory, has the largest voltage swing and looks like the response of a single SQUID amplified six times, which is the number of tiers. Ideally what is desired is a large voltage swing only around the zero magnetic field, which can be commonly referred to as an "anti-peak", and little to no oscillations away from the zero magnetic field. The anti-peak response can allow the user to determine when signal strength is too strong.

Figure 7:
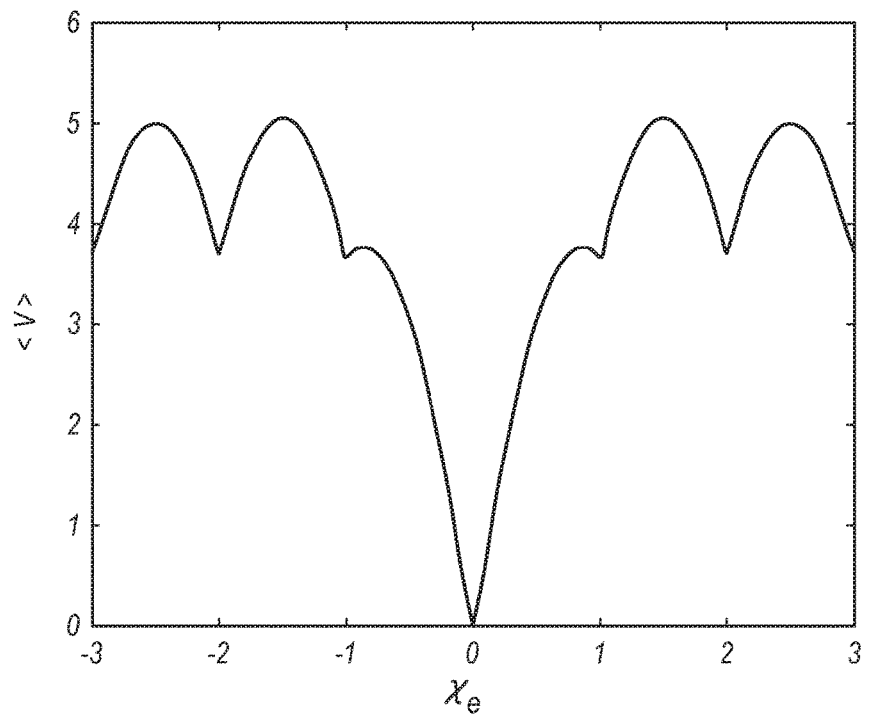
FIG. 7 is the same graph as FIG. 4, but with both critical current and loop size decreasing for each tier.

Finally, and referring now to FIG. 7, FIG. 7 is a graph of the voltage response {V} for an array with both decreasing β and decreasing $i_c$ values. This response does seem to have an anti-peak, however there is still some periodicity. Although not shown in FIG. 7, there can still be other anti-peaks around ±60n, where n=0, 1, 2, . . . since 60 is the least common multiple of 1, 2, 3, 4, 5, 6 (6 was used because there are six tiers T in the triangular array 12).

Based on the result of simulations as depicted in FIGS. 4-7, it can be determined that the ideal setup for the triangular array of SQUIDs would be to arrange SQUID's in the array with decreasing $i_c$'s with a Gaussian distribution of β's around β=1. Alternatively, the different $i_c$'s and β's can have a random distribution within the array, which can increase the total, overall anti-peak voltage response for the array.

Figure 8:
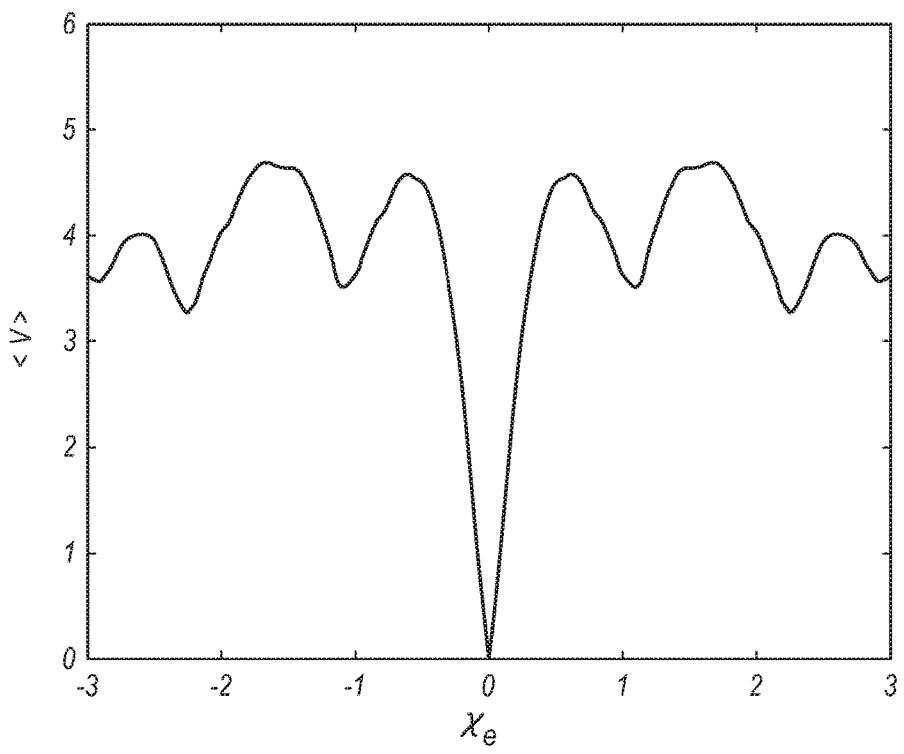
FIG. 8 is the same graph as FIG. 7, but with the loop size decreasing according to a Gaussian distribution of between $\beta=0.5$ and $\beta=1.5$.
Figure 9:
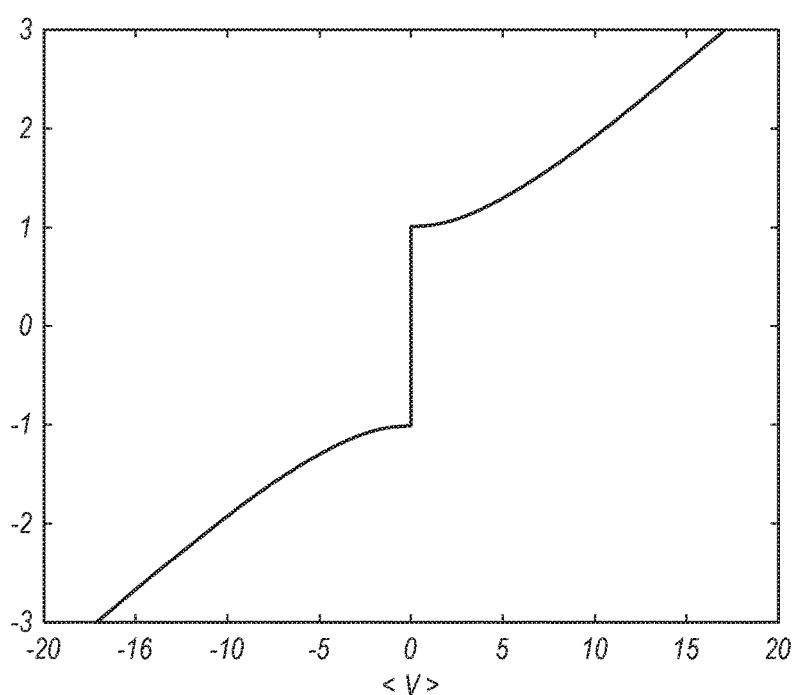
FIG. 9 is a graph of current versus voltage for the device of FIG. 8.

With a Gaussian distribution of loop sizes between β=0.5 and β=1.5 with decreasing values of $i_c$, the {V} response shown in FIG. 8 can be obtained. This can be the response typically desired when designing an array of non-uniform SQUIDs (also referred to as a superconducting quantum interference filter, or SQIF). There can be a large voltage swing, little oscillation away from the zero magnetic field, and the anti-peak is quite linear. FIG. 9 can be the current-voltage curve for this embodiment. The plot in FIG. 9 can be created by inputting values of J between −3 and 3 and recording the voltage output at $x_e$=0. When −1≤J≤1 the voltage is zero. This is the superconducting state. To get the largest voltage swing in {V}, a J value on right at the edge of the transition in FIG. 9 could be used in Eq. (1).

II. Modular Connections

Figure 10:
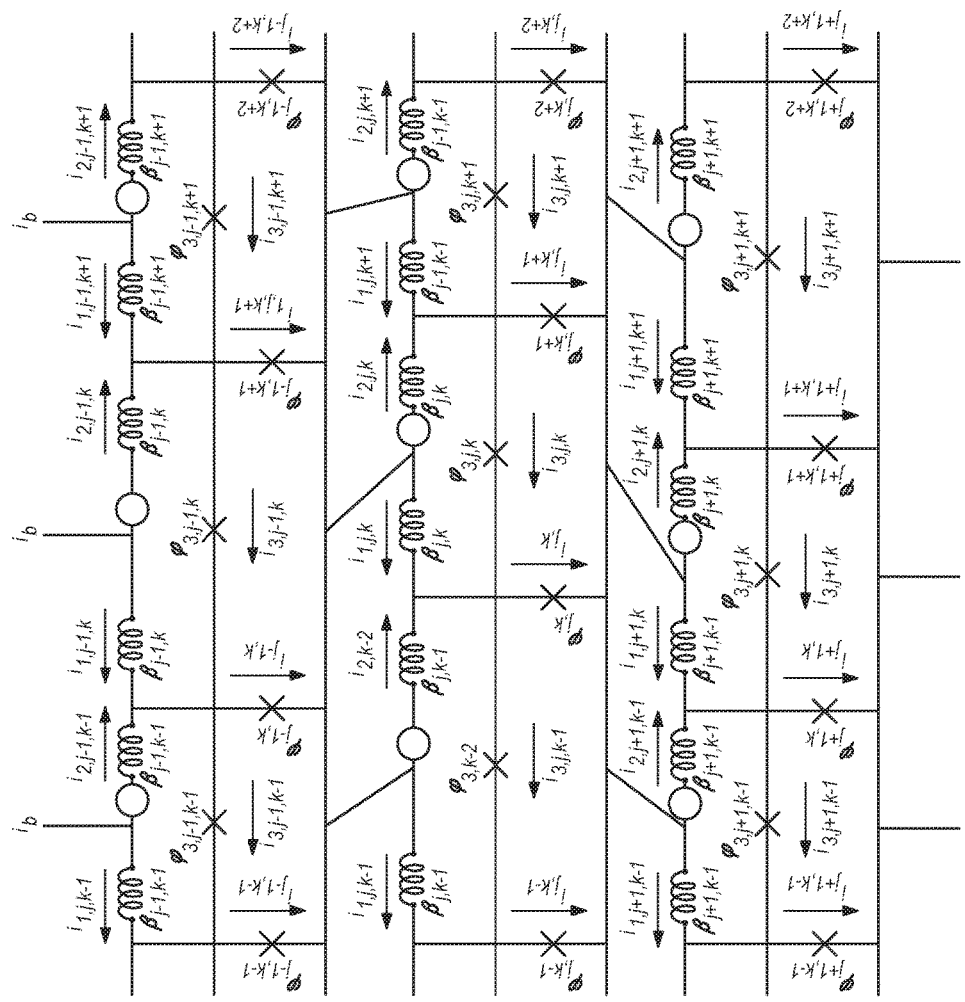
FIG. 10 is a schematic diagram of a portion of a 10×10 array of bi-SQUIDs.

The above modeling represents an embodiment wherein a single DC SQUID was used in sub-blocks 14. For sub-blocks 14, a single RF SQUID, DC SQUID or bi-SQUID could be used. To improve the anti-peak voltage response, arrays of bi-SQUIDs could be used in the sub-blocks instead of single SQUIDs. Typically, a representative chip will be able to hold a lot more SQUIDs than the array 12 of twenty-one DC SQUIDs 16 shown in FIG. 2, and each sub-block 14 can actually be an N×M sub-array of SQUIDs. Accordingly, in several alternative embodiments, each single SQUID in sub-block 14 can be replaced by a 10×10 array of bi-SQUIDs. A schematic of a portion of the 10×10 array of bi-SQUIDs is shown in FIG. 10. Thus, alternative embodiments can increase in complexity by both using a two-dimensional array for sub-block 14 and by using the bi-SQUID design over the SQUID design (although sub-array of DC SQUIDs and RF SQUIDs could also be used). Non-uniform bi-SQUID arrays are used because non-uniform arrays of bi-SQUIDs can have superior linearity in the anti-peak feature in voltage response.

The phase dynamics of a 2D bi-SQUID array are in Eq. (2) through (7) below:

$$2\dot{\varphi}_{1,1} - \dot{\varphi}_{1,2} = \quad (2)$$
$$\frac{i_b}{2} + \frac{1}{\beta_{1,1}}(\varphi_{c,1,1} + \varphi_{1,2} - \varphi_{1,1}) - i_{c,1,1}\sin\varphi_{1,1} + i_{c_3,1,1}\sin(\varphi_{1,2} - \varphi_{1,1})$$

$$-\dot{\varphi}_{1,k-1} + 3\dot{\varphi}_{1,k} - \dot{\varphi}_{1,k+1} = \quad (3)$$
$$i_b + \frac{1}{\beta_{1,k}}(\varphi_{c,1,k} + \varphi_{1,k+1} - \varphi_{1,k}) - \frac{1}{\beta_{1,k-1}}(\varphi_{c,1,k-1} + \varphi_{1,k} - \varphi_{1,k-1}) -$$
$$i_{c,1,k}\sin\varphi_{1,k} + i_{c_3,1,k}\sin(\varphi_{1,k+1} - \varphi_{1,k}) - i_{c_3,1,k-1}\sin(\varphi_{1,k} - \varphi_{1,k-1})$$

$$-\dot{\varphi}_{1,N} + 2\dot{\varphi}_{1,N_1} = \frac{i_b}{2} - \frac{1}{\beta_{1,N}}(\varphi_{c,1,N} + \varphi_{1,N_1} - \varphi_{1,N}) - \quad (4)$$
$$i_{c,1,N_1}\sin\varphi_{1,N_1} - i_{c_3,1,N}\sin(\varphi_{1,N_1} - \varphi_{1,N})$$

$$-\frac{\dot{\varphi}_{j-1,1}}{2} - \frac{\dot{\varphi}_{j-1,2}}{4} + 2\dot{\varphi}_{j,1} - \dot{\varphi}_{j,2} = \quad (5)$$
$$\frac{1}{\beta_{j,1}}(\varphi_{c,j,1} + \varphi_{j,2} - \varphi_{j,1}) - i_{c,j,1}\sin\varphi_{j,1} + \frac{1}{2}i_{c,j-1,1}\sin\varphi_{j-1,1} +$$
$$\frac{1}{4}i_{c,j-1,2}\sin\varphi_{j-1,2} + i_{c_3,j,1}\sin(\varphi_{j,2} - \varphi_{j,1})$$

$$3\dot{\varphi}_{j,k} - \frac{\dot{\varphi}_{j-1,k}}{2} - \frac{\dot{\varphi}_{j-1,k+1}}{4}$$

$$-\frac{\dot{\varphi}_{j-1,k-1}}{4} - \dot{\varphi}_{j,k+1} - \dot{\varphi}_{j,k-1} = \frac{1}{\beta_{j,k}}(\varphi_{c,j,k} + \varphi_{j,k+1} - \varphi_{j,k}) - \quad (6)$$
$$\frac{1}{\beta_{j,k-1}}(\varphi_{c,j,k-1} + \varphi_{j,k} - \varphi_{j,k-1}) - i_{c,j,k}\sin\varphi_{j,k} + \frac{1}{2}i_{c,j-1,k}\sin\varphi_{j-1,k} +$$
$$\frac{1}{4}i_{c,j-1,k+1}\sin\varphi_{j-1,k+1} + \frac{1}{4}i_{c,j-1,k-1}\sin\varphi_{j-1,k-1} +$$
$$i_{c_3,j,k}\sin(\varphi_{j,k+1} - \varphi_{j,k}) - i_{c_3,j,k-1}\sin(\varphi_{j,k} - \varphi_{j,k-1})$$

-continued $$2\dot{\varphi}_{j,N_1} - \frac{\dot{\varphi}_{j-1,N}}{4} - \frac{\dot{\varphi}_{j-1,N_1}}{2} - \varphi_{j,N} = \quad (7)$$

$$-\frac{1}{\beta_{j,N}}(\varphi_{c,j,N} + \varphi_{j,N_1} - \varphi_{j,N}) - i_{c,j,N_1}\sin\varphi_{j,N_1} +$$

$$\frac{1}{2}i_{c,j-1,N_1}\sin\varphi_{j-1,N_1} + \frac{1}{4}i_{c,j-1,N}\sin\varphi_{j-1,N} - i_{c_3,j,N}\sin(\varphi_{j,N_1} - \varphi_{j,N})$$

For these equations, $N_1=N+1$, $j=2$: M, $k=2$: N and $i_{c3,j,k}$ is the critical current of the third junction. This is a set of six differential equations which represent a total of M (N+1) phase equations. The derivations were not shown for brevity and can be found in the Berggren thesis cited above.

A. The Voltage Derivative and Linearity

Figure 11:
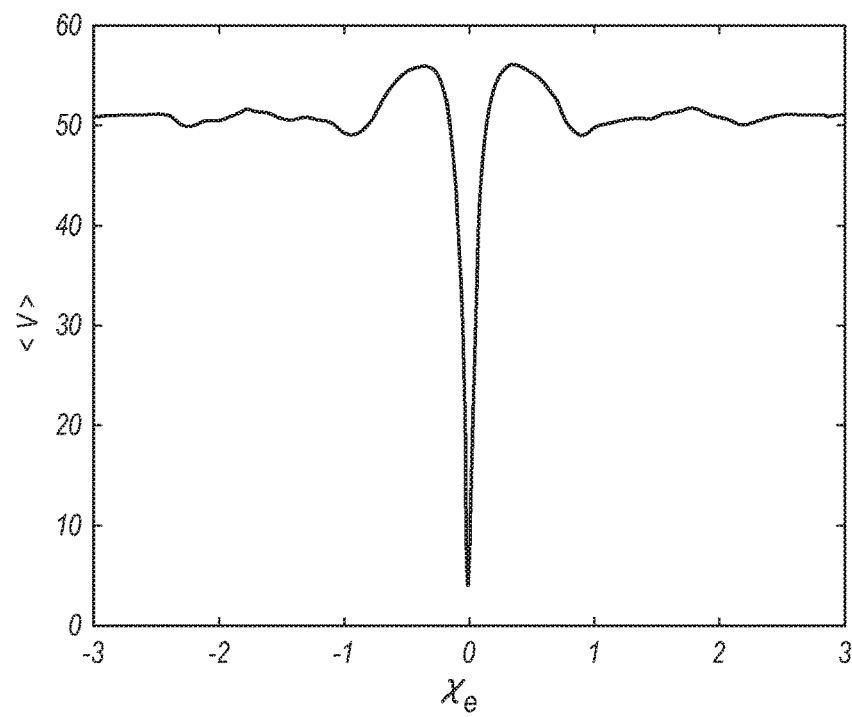
FIG. 11 is a graph of the voltage response of the planar SQUID face for the array of bi-SQUIDs of FIG. 10, when arranged in accordance with the methods of the present invention.

Each of the 10×10 arrays was simulated with Gaussian distributions of β and $i_c$ values depending on their tier in the array. The individual {V} were then summed to achieve the voltage response shown in FIG. 11. The average voltage response has a very large anti-peak with very few oscillations away from the zero magnetic field. The triangular array design with sub-blocks of bi-SQUID arrays seems to result in an ideal {V}.

B. Comparison with a 35×60 Rectangular Array

From the above, it can be seen that a triangular configuration can result in improved anti-peak response. To determine if there is any significant improvement over a square array of the same size (i.e., the same number is RF SQUIDs, bi-SQUIDS or DC SQUIDs), a triangular array of 21 10×10 bi-SQUID array sub-blocks 14 can be compared to a rectangular array of 35×60 bi-SQUIDs. Both arrays have 2100 bi-SQUIDs.

Figure 12:
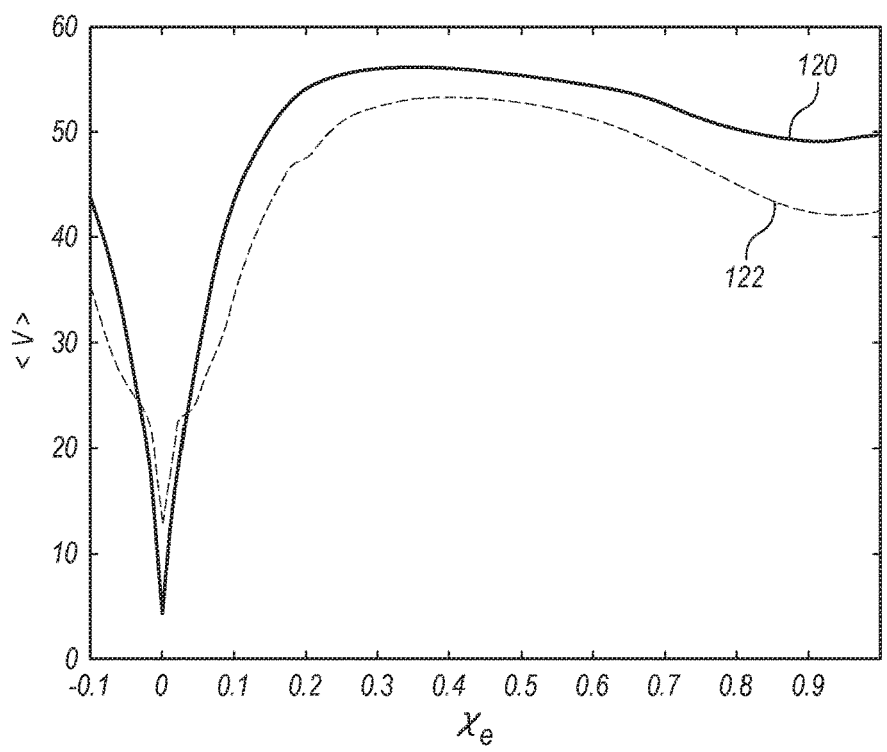
FIG. 12 is a graph of voltage response of a rectangular array of SQUIDs, when compared to an array arranged according to the methods of the present invention.
Figure 13:
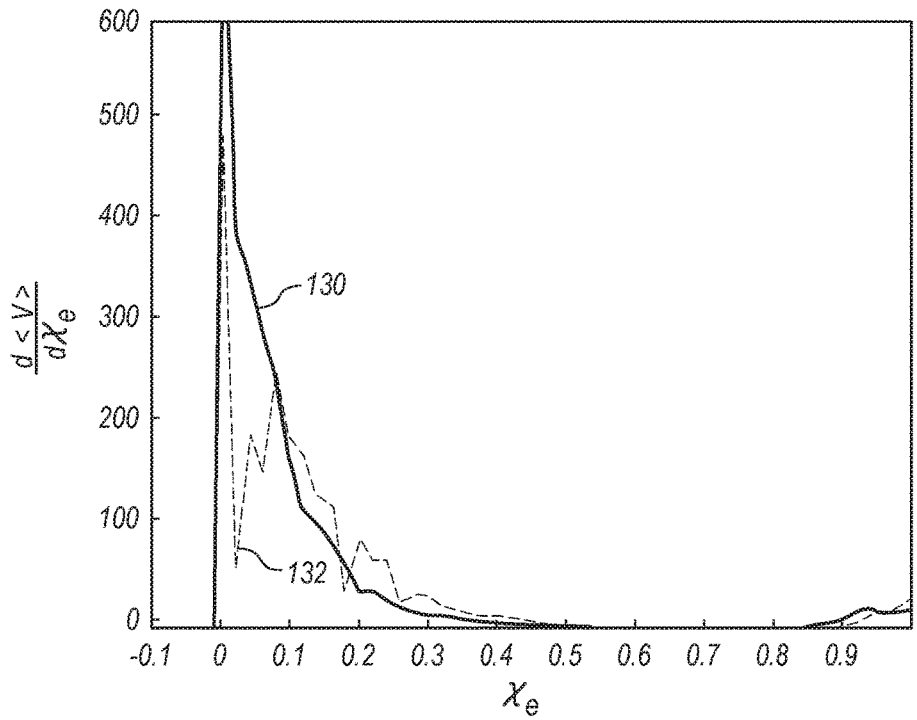
FIG. 13 is graph of the derivative of the voltage response of FIG. 12, which shows the increased linearity of the device and methods according to several embodiments; and, FIG. 14 is a block diagram, which is representative of steps that can be taken to accomplish the methods of the present invention according to several embodiments.

FIG. 12 compares the average voltage response. The triangular configuration of sub-blocks of 10×10 sub-arrays of bi-SQUIDs (graph 120) can have a much smoother anti-peak and larger voltage swing than the 35×60 array of the prior art (graph 122). This is also seen in the linearity plot in FIG. 13, where the 10×10 sub-block arrangement (graph 130) can have a more linear anti-peak than the large 35×60 array (graph 132), which would result in less signal distortion for the device and methods of the present invention.

From the above, it can be see that one of the benefits of the present invention can be that, given a particular number of SQUIDs to work with, the response can be improved simply by rearranging from a rectangular configuration to a triangular configuration, or similar configuration with a plurality of tiers T where the number sub-blocks in adjacent tiers T is different, as described above. The anti-peak can have greater dynamic range and increased linearity. It is also easier to fabricate 21 similar small arrays of 100 bi-SQUIDs that one large array of 2100 bi-SQUIDs. An additional utility of the present invention according to several embodiments can be that it maximizes the magnetic field collection area when fabricating a 3-D SQUID array on the face of a pyramid.

Not only can the device present invention be an antenna, more fundamentally, it can be a sensor that can directly measure magnetic fields from DC to theoretically THz frequencies (the upper limit is dependent on the transition temperature of the superconductor used). In terms of its utility as an antenna, it can directly measure the magnetic field component of an electromagnetic wave. An ideal Josephson junction can operate at frequencies from DC to a value equivalent to its superconducting energy gap ($\Delta(T)$, the energy needed to decouple the paired electrons) where $f_{max}=\Delta/h$ (where h is Planck's constant). Since the energy gap is related to the critical temperature ($T_c$) [$2\Delta(0)=3.528 k_B T_c$ where $k_B$ is the Stefan-Boltzmann constant], the higher the critical temperature, the higher the maximum operating frequency. Theoretically this should allow SQUIDs that incorporate Nb materials to operate up to about 644 GHz and $YBa_2Cu_3O_{7-x}$ SQUIDs to about 6.5 THz.

Figure 14:
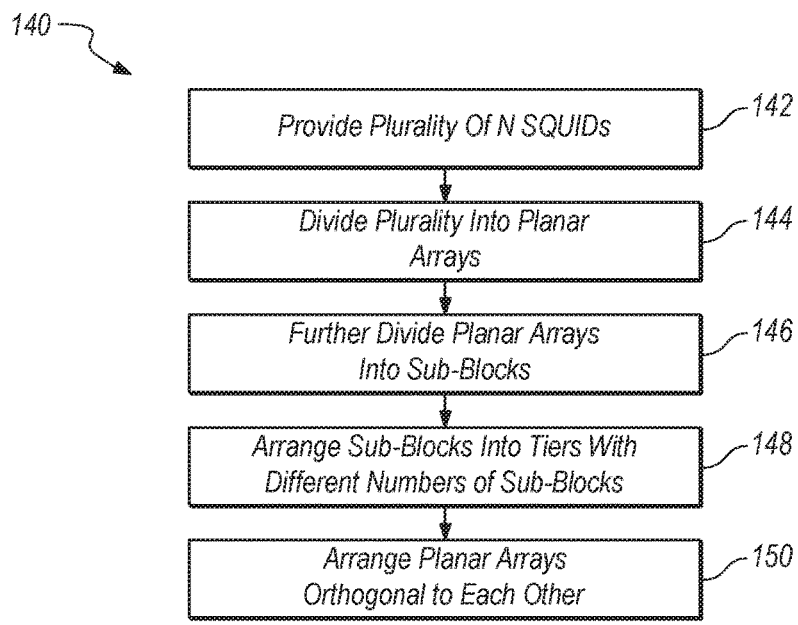

Referring now to FIG. 14, a block diagram 140 is shown, which can illustrate steps that can be taken to practice the methods of the present invention according to several embodiments. As shown method 140 can include the initial step 142 of providing a plurality of N SQUIDs, and then dividing the plurality of N SQUIDs into three planar arrays 12, as shown by step 144. The methods can further include the step 146 of dividing the planar array 12 into sub-blocks 14 of SQUIDs 16. As detailed above, the SQUIDs 16 for sub-blocks 14 can be DC SQUIDs, RF SQUIDs, bi-SQUIDs, or even sub-arrays of DC SQUIDs, RF SQUIDs, and bi-SQUIDs.

Once the sub-blocks are divided, and as shown in FIG. 14, the methods can include the step 148 of arranging the sub-blocks into tiers $T_i$. Step 148 should be accomplished so that each tier $T_i$ has a different number of sub-blocks 14 than any immediately adjacent tier $T_j$. Also, the tiers T can be connected so that the total bias current ib is the same for each tier $T_i$. To do this, the critical current $i_c$ and loop size β for each SQUID in a sub-block should be different; the differences can be according to a Gaussian or random distribution, as described above. Once the planar arrays 12 are configured in this manner, the arrays can be arranged so that they are orthogonal to each other, as shown by step 150 in FIG. 14.

The use of the terms "a" and "an" and "the" and similar references in the context of describing the invention (especially in the context of the following claims) is to be construed to cover both the singular and the plural, unless otherwise indicated herein or clearly contradicted by context. The terms "comprising", "having", "including" and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. An antenna, comprising:
   a plurality of N Superconducting Quantum Interference Devices (SQUIDs);
   said plurality of N SQUIDs divided into three planar arrays of said SQUIDs;
   each of said planar arrays being further divided into a plurality of sub-blocks of said SQUIDs, said sub-blocks being arranged in a plurality of X $T_x$ tiers;
   each said planar array being fed with its own respective total planar input bias current $i_b$, each said $T_X$ tier having the same said total planar input bias current $i_b$ but a different number of said sub-blocks of said SQUIDs than any immediately adjacent said $T_x$ tier; and,
   said planar arrays being arranged so that each said planar array is orthogonal to each other said planar array.

2. The device of claim 1, wherein each of said sub-blocks comprises an RF SQUID.

3. The device of claim 1, wherein each of said sub-blocks comprises a bi-SQUID.

4. The device of claim 1, wherein each of said sub-blocks comprises a DC-SQUID.

5. The device of claim 1, wherein each of said sub-blocks comprises an N×M array of bi-SQUIDs.

6. The device of claim 1, wherein each said SQUID in a respective said $T_x$ tier has a different loop size, and further wherein said loop sizes have a Gaussian distribution of between 0.5 and 1.5.

7. The device of claim 1 wherein said planar array is triangular when viewed in plan view.

8. The device of claim 1 where each said tier $T_X$ has a plurality of p sub-blocks, said p sub-blocks each having an input sub-block bias current that is equal to said total planar input bias current $i_b$ divided by p.

9. A method for detecting a three-dimensional magnetic field using Superconducting Quantum Interference Device (SQUID) devices, comprising the steps of:
   A) providing a plurality of N SQUID's;
   B) dividing said plurality of N SQUID's into three planar arrays of said SQUIDs;
   B1) feeding each planar array with its own total planar input bias current $i_b$;
   C) further dividing each said planar array from said step B) into a plurality of sub-blocks of said SQUIDs;
   D) arranging said sub-blocks in a plurality of X $T_x$ tiers so that each said $T_i$ tier has a different number of said sub-blocks than any immediately adjacent said $T_i$ tier, but also so that each said $T_i$ tier has the same total planar input bias current $i_b$ from said step B1); and,
   E) arranging said planar arrays so that each planar array from said step B) is orthogonal to each other said planar array from said step B).

10. The method of claim 9, wherein said sub-blocks in said step C) are RF SQUIDs.

11. The method of claim 9, wherein said sub-blocks in said step C) are bi-SQUIDs.

12. The method of claim 9, wherein said sub-blocks in said step C) are DC-SQUIDs.

13. The method of claim 9, wherein said sub-blocks in said step C) are N×M sub-arrays of bi-SQUIDs.

14. The method of claim 13, wherein said step D) is accomplished so that each said SQUID on said tier $T_i$ has a different loop size, and further so that said loop sizes have a random distribution normalized said loop sizes of between 0.5 and 1.5.

15. The method of claim 9, wherein said step D) is accomplished so that each said tier $T_i$ has a plurality of p sub-blocks and said bias current for said sub-block in said tier $T_i$ is the total bias current divided by p.

16. The method of claim 9, wherein said step B) is accomplished so that said planar array is triangular when viewed in plan view.

17. A method of improving the sensitivity of a planar array of N SQUIDs comprising the steps of:
   A) dividing said N SQUIDs into a plurality of sub-blocks;
   A1) feeding said planar array with a total planar input bias current $i_b$;
   B) arranging said sub-blocks in X tiers $T_1, T_2, T_3 \ldots T_x$ of said SQUIDs, so that each said $T_X$ tier has a different number of said sub-blocks of said SQUIDs than any immediately adjacent said $T_X$ tier; and,
   C) connecting said tiers $T_X$ so that each said $T_X$ tier has the same said total planar input bias current $i_b$ from said step A1).

18. The method of claim 17, wherein said SQUIDs in said sub-blocks are selected from the group consisting of RF SQUIDs, DC SQUIDs, bi-SQUIDs and sub-arrays of bi-SQUIDs.

19. The method of claim 17, wherein said SQUIDs each have a respective loop size, and wherein said step B) is accomplished using said SQUIDs with different loop sizes, and with said different loop sizes having a Gaussian distribution of between 0.5 and 1.5.

20. The method of claim 17 wherein accomplishment of said step B) results in a planar configuration of said tiers $T_X$ that is triangular when viewed in plan view.

* * * * *